United States Patent
Del Croce et al.

(10) Patent No.: US 12,323,135 B2
(45) Date of Patent: Jun. 3, 2025

(54) HIGH-SIDE SEMICONDUCTOR SWITCH WITH OVER-CURRENT PROTECTION

(71) Applicant: Infineon Technologies AG, Neubiberg (DE)

(72) Inventors: Paolo Del Croce, Villach (AT); Francesco Morandotti, Villach (AT)

(73) Assignee: Infineon Technologies AG, Neubiberg (DE)

( * ) Notice: Subject to any disclaimer, the term of this patent is extended or adjusted under 35 U.S.C. 154(b) by 162 days.

(21) Appl. No.: 18/182,989

(22) Filed: Mar. 13, 2023

(65) Prior Publication Data

US 2023/0308089 A1    Sep. 28, 2023

(30) Foreign Application Priority Data

Mar. 25, 2022 (DE) .......................... 102022107156.1

(51) Int. Cl.
 H03K 17/082 (2006.01)
 H02H 3/02 (2006.01)

(52) U.S. Cl.
 CPC ......... H03K 17/0822 (2013.01); H02H 3/025 (2013.01)

(58) Field of Classification Search
 CPC ...... H03K 17/0822; H02H 3/025; H02H 9/02; H02H 3/08; H02H 3/087
 See application file for complete search history.

(56) References Cited

U.S. PATENT DOCUMENTS

| | | | |
|---|---|---|---|
| 8,045,310 B2 | 10/2011 | Zanardi et al. | |
| 2011/0007442 A1* | 1/2011 | Fukuhara | H03K 17/163 361/103 |
| 2017/0063074 A1* | 3/2017 | Yasusaka | H01L 29/866 |
| 2023/0095018 A1* | 3/2023 | Yoshimura | H02H 9/02 327/100 |

FOREIGN PATENT DOCUMENTS

DE    102010064258 A1    7/2011

OTHER PUBLICATIONS

Office Action from counterpart German Application No. 102022107156.1 dated Feb. 7, 2023, 5 pp.

* cited by examiner

*Primary Examiner* — Jared Fureman
*Assistant Examiner* — Christopher J Clark
(74) *Attorney, Agent, or Firm* — Shumaker & Sieffert, P.A.

(57) ABSTRACT

A circuit may be used as an intelligent semiconductor switch. The circuit includes a high-side power transistor having a load current path coupled between a supply node and an output node, which is configured to provide, during operation, a load current to a load. The circuit further includes a gate driver circuit coupled to a control electrode of the power transistor, and a first stage of an overcurrent protection circuit coupled to the control electrode of the power transistor and configured to drive the control electrode such that a voltage drop across the load current path of the power transistor increases upon detection that the load current has reached a first threshold value. A second stage of the overcurrent protection circuit is coupled to the control electrode of the power transistor and configured to drive the control electrode.

15 Claims, 3 Drawing Sheets

HIGH-SIDE SEMICONDUCTOR SWITCH WITH OVER-CURRENT PROTECTION

This Application claims priority to German Application Number 102022107156.1, filed on Mar. 25, 2022, the entire content of which is incorporated herein by reference.

TECHNICAL FIELD

The present disclosure relates to the field of intelligent semiconductor switches in particular to a high side semiconductor switch with over-current protection.

BACKGROUND

A wide variety of types of intelligent semiconductor switches for different applications (e.g., in automotive or industrial applications) are known. In addition to the actual switch (usually a high-side power MOSFET), such semiconductor switches may include further circuits, for example to switch the semiconductor switch on and off and, if necessary, to output diagnostic information (e.g. load current, temperature, etc.) or to protect the switch from overload (e.g. due to excessive temperature or load currents). An intelligent semiconductor switch may also have multiple channels, each containing one semiconductor switch for driving a load.

An overload of the semiconductor switch due to excessive load current (over-current) may occur, for example, due to a short circuit in or a similar malfunction of the load connected to the semiconductor switch. Various concepts for protecting the semiconductor switch from over-current are known. Such concepts usually combine a current sense circuit and some kind of comparator circuit, which may trigger a switch-off of the semiconductor switch upon detection that the load current exceeds a defined threshold value. Alternatively, a load current limitation may be implemented instead of a hard switch-off—A current limitation usually ensures that the load current does not exceed a defined maximum current.

Current sense resistors (sometimes also referred to as shunt resistors) can be used to sense the load current. However, in high-side switches current measurement with a sense resistor may face some problems due to the limited voltage headroom available for the voltage drop across the resistor. Particularly the precise setting of the mentioned current threshold or current limit may be difficult. The inventors identified a need for improvement of existing concepts for over-current protection in intelligent semiconductor switches.

SUMMARY

A circuit which may be uses as an intelligent semiconductor switch is described herein. In accordance with one embodiment, the circuit includes a high—side power transistor having a load current path coupled between a supply node and an output node, which is configured to provide, during operation, a load current to a load. The circuit further includes a gate driver circuit coupled to a control electrode of the power transistor, and a first stage of an overcurrent protection circuit coupled to the control electrode of the power transistor and configured to drive the control electrode such that a voltage drop across the load current path of the power transistor increases upon detection that the load current has reached a first threshold value. A second stage of the overcurrent protection circuit is coupled to the control electrode of the power transistor and configured to drive the control electrode such that the load current is limited to a maximum value or that the power transistor is switched off upon detection that the load current has reached a second threshold value.

Furthermore, a method for overcurrent protection in an intelligent semiconductor switch is described. In accordance with one embodiment the method includes driving a power transistor into a conductive state by charging a control electrode of the power transistor. The method further includes driving the control electrode such that a voltage drop across a load current path of the power transistor increases when the load current reaches a first threshold value, and driving the control electrode such that the load current is limited to a maximum value or switch off the power transistor when the load current has reached a second threshold value.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings.

DETAILED DESCRIPTION

Figure 1:
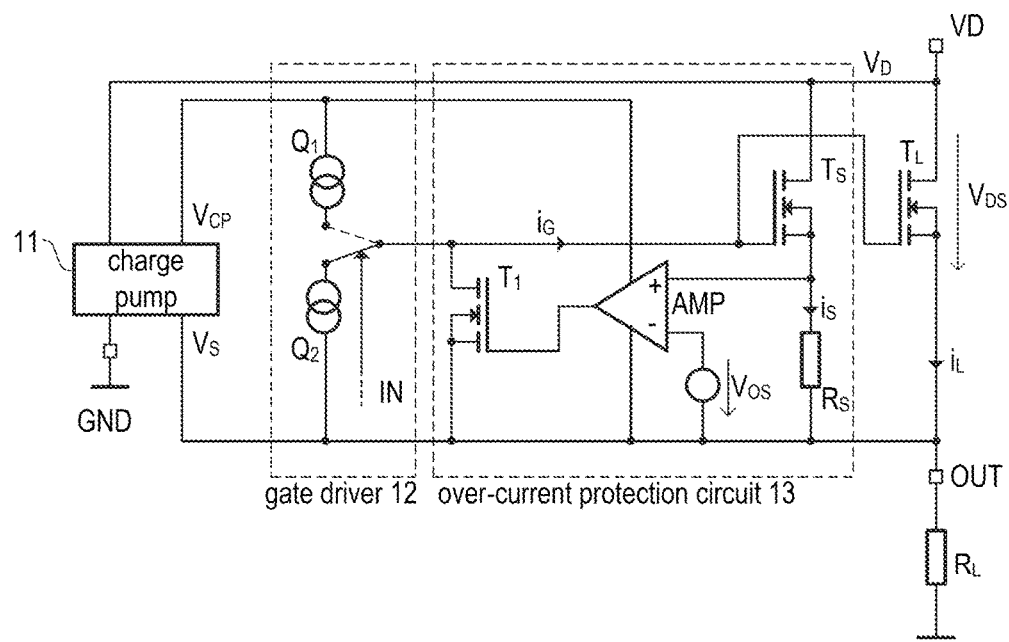
FIG. 1 illustrates one example of a high-side semiconductor switch with a simple over-current protection circuit.

FIG. 1 illustrates one example of a high-side semiconductor switch with a simple over-current protection circuit. The high-side semiconductor switch may be implemented as a MOS (Metal-Oxide-Semiconductor) Field-Effect Transistor (MOSFET). For example, a DMOS (Double-Diffused MOS) transistor may be used, which is composed of a plurality of transistors cells connected in parallel (i.e. having a common gate, a common drain, and a common source electrode). The plurality of transistor cells are usually arranged in a so-called cell array.

In the depicted example, the (e.g. DMOS) power transistor, denoted as $T_L$, is connected between a supply node VD and an output node OUT, at which an electric load is connected during operation. In FIG. 1, the electric load is symbolized by the resistor $R_L$. However, it is understood that the load may also be a more complex circuit, which may include various active and passive electronic circuit components. The nodes VD and Out may be connected to respective chip terminals to allow the connection of external circuity. IN the depicted example, the supply voltage $V_D$ is applied at the supply node/terminal VD and thus also to the drain electrode of the power transistor $T_L$. The voltage present at the output node OUT is denoted $V_S$.

The gate of the power transistor $M_L$ is usually driven (charged/discharged) by a so-called gate driver circuit, which is labelled with the reference numeral 12 in FIG. 1. Various suitable gate driver circuits are as such known and thus not discussed herein in more detail. FIG. 1 illustrates merely a simplified example of a gate driver, in which either current source $Q_1$ (providing a positive gate current $i_G$>0) or current source $Q_2$ (providing a negative gate current $i_G$>0) is connected to the gate electrode of the transistor $T_L$ in accordance with the level of the logic signal IN. For example, a High Level of the logic signal IN (IN=1) may cause the current source $Q_1$ to provide a positive gate current $i_G$, thus charging the gate of the transistor $T_L$ and switching the transistor on. Similarly, a Low Level of the logic signal IN (IN=0) may cause the current source $Q_2$ to provide a negative gate current $i_G$, thus discharging the gate of the transistor $T_L$ and switching the transistor off.

The current source $Q_1$ may be coupled between a charge pump output (output voltage $V_{CP}$) and the gate electrode of transistor $T_L$, whereas the current source $Q_2$ may be coupled between the gate electrode of transistor $T_L$ and its source electrode (connected to output node OUT). The charge pump (labeled with reference numeral 11) is configured to provide a supply voltage $V_{CP}$–$V_S$ for the gate driver 12 and other circuitry for which the electric potential $V_S$ represents the reference potential (floating ground). Various suitable charge pump and other circuits for providing the voltage $V_{CP}$ are as such known and thus not further discussed herein.

The over-current protection circuit uses a so-called sense-transistor $T_S$ and a resistor $R_S$ for current sensing and an amplifier circuit (operational amplifier AMP and transistor T1) for current limiting. The sense transistor $T_S$ may be composed of one or more transistor cells of the cell array of the power transistor $T_L$. The transistors $T_S$ and $T_L$ have common gate and drain electrodes but separated source electrodes. Therefore, the drain current (provided by the voltage supply) is divided into the load current $i_L$ and the sense current $i_S$, wherein the sense current is approximately proportional to the load current and the proportionality factor is determined by the ratio of the active areas (or the ratio of the number of transistor cells) of the transistors $T_L$ and $T_S$. To convert the sense current $i_S$ into a voltage signal, a current sense resistor is coupled between the source electrode of the sense transistor $T_S$ and the output node OUT.

The voltage $i_S \cdot R_S$ across the resistor $R_S$ as well as a reference voltage $V_{OS}$ (offset voltage) are supplied to the amplifier circuit, which is configured to sink such a current from the gate electrode of the power transistor $T_L$ that the sense current $i_S$ is approximately equal to a threshold current (maximum current) $V_{OS}/R_S$. The threshold/maximum current is determined by the reference voltage $V_{OS}$ and the resistance of the resistor $R_S$. To limit the load current $i_L$ the transistor $T_1$ is coupled between the gate electrode and the source electrode of the transistor $T_L$ while the gate of the transistor $T_1$ is driven by the output of the operational amplifier AMP based on the difference $R_S \cdot i_S$–$B_{OS}$ (which is proportional to the difference $i_S$–$V_{OS}/R_S$). The operational amplifier AMP may be supplied by the voltage $V_S$ (output voltage at output node OUT) and the voltage $V_{CP}$ provided by the charge pump 11. In some embodiments the operational amplifier AMP may operate as or be replaced by a comparator (which is considered as a differential amplifier with a high gain). When the operational amplifier AMP is replaced by a comparator, it may operate in open-loop mode to trigger an overcurrent switch-off when the difference $R_S \cdot i_S$–$B_{OS}$ becomes positive. This also applies to other examples described herein.

As can be seen from FIG. 1, the offset voltage $V_{OS}$ determines the current threshold value/current limit. When fully switched on, the power transistor $T_L$ typically has an on-resistance of approximately 1 milliohm. Assuming that overload protection should be triggered at a load current of 30 amperes, the voltage drop across the on-resistance of the power transistor $T_L$ is 30 millivolts (drain-source-voltage $V_{DS}$). That is, the theoretic maximum voltage across the sense resistor is also 30 millivolts in this example, and, obviously, the offset voltage $V_{OS}$ needs to be (significantly) smaller than 30 millivolts so that the amplifier AMP can operate properly.

However, the offset voltage $V_{OS}$ cannot be set arbitrary small, because, when the offset voltage $V_{OS}$ is too small, it is no longer negligible compared to the systematic (but practically random) offset of the operational amplifier AMP, which deteriorates accuracy. Accordingly, the required accuracy determines a lower bound for the offset voltage, which is typically larger than the drain-source voltage $V_{DS}$ of the power transistor $T_L$. With the constraint that $V_{OS}$ needs to be smaller than $V_{DS}$ during the on-state of the power transistor $T_L$, the overcurrent protection circuit 13 of FIG. 1 can only be used in applications, in which the accuracy requirements are rather low (so that $V_{OS}$ can be set to sufficiently low values).

To improve the situation, a novel concept is discussed below, which allows higher offset voltages $V_{OS}$ as compared to the example of FIG. 1 by using an overcurrent protection circuit that has two stages which become active one after another as the load current increases towards the preset current limit. One example is illustrated in FIG. 2.

Figure 2:
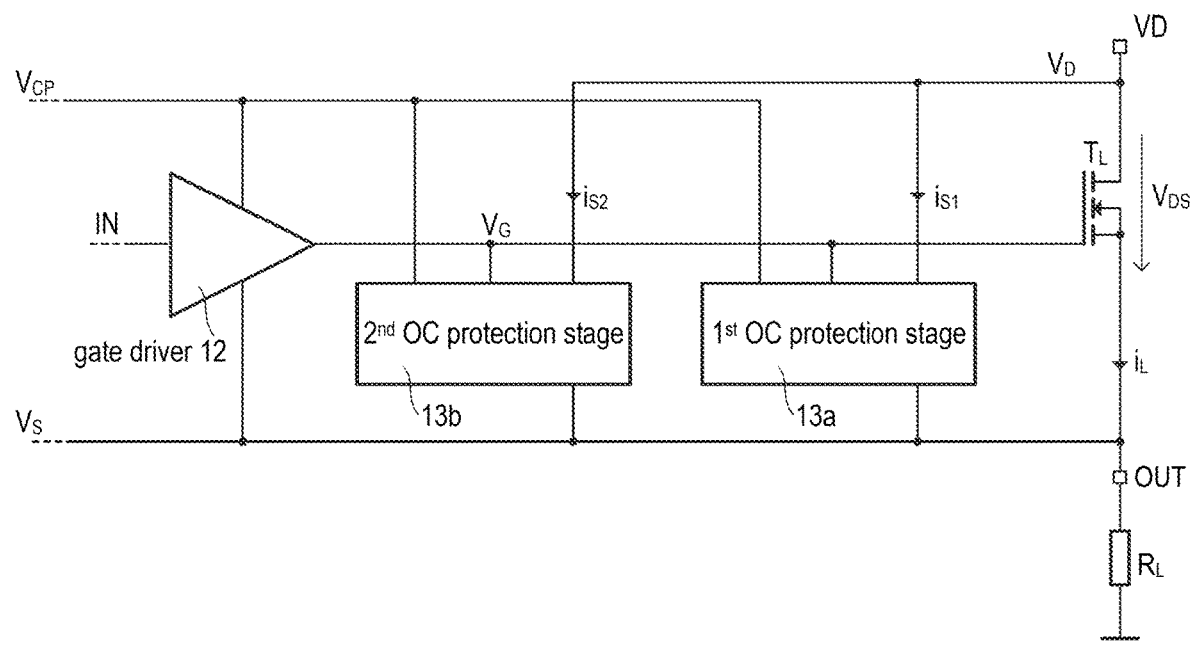
FIG. 2 illustrates one general example of an intelligent semiconductor switch with an overcurrent protection in accordance within the embodiments described herein.

The circuit of FIG. 2 includes, as power semiconductor switch, a high—side DMOS transistor $T_L$, which has a load current path (drain-source current path) coupled between a supply node VD and an output node OUT. The nodes VD and OUT may be connected to respective chip terminals. The output node OUT provides, during operation (i.e. while the transistor $T_L$ is switched on), a load current $i_L$ to an electric load $R_L$. A driver circuit 12 is coupled to the control (gate) electrode of the power transistor $T_L$. Various suitable gate driver implementations are as such known and thus not further discussed herein. Similar to the example of FIG. 1, a charge pump may be used to supply the gate driver with a supply voltage $V_{CP}$ which is higher than the voltage $V_S$ at the output node. Accordingly, the gate driver 12 "sees" the voltage difference $V_{CP}$–$V_S$ as supply voltage. The electric potential at the output node OUT is the reference potential (floating ground) for the gate driver as well as for the overcurrent protection circuit described below.

As mentioned, the circuit of FIG. 2 has a two-stage over-current protection circuit 13. The first stage 13a of the overcurrent protection circuit is coupled to the gate electrode of the power transistor $T_L$ and configured to drive the control electrode (by modifying the gate voltage $V_G$) such that the voltage drop $V_{DS}$ across the load current path of the power transistor $T_L$ increases upon detection that the load current $i_L$ has reached a first threshold value $i_{TH1}$. This first threshold value $i_{TH1}$ is lower than the actual current limit that is represented by a second threshold value $i_{TH2}$.

The second stage 13b of the overcurrent protection circuit is also coupled to the gate electrode of the power transistor $T_L$ and configured to drive the control electrode (by further modifying the gate voltage $V_G$) such that the load current $i_L$ is limited to a maximum value $i_{LMAX}$ upon detection that the load current $i_L$ has reached the second threshold value $i_{TH2}$. The second threshold value may be (but not necessarily is) equal to the maximum load current $i_{LMAX}$. Alternatively, instead of limiting the load current $i_L$ to the maximum current $i_{LMAX}$, the power transistor $T_L$ may be switched off upon detection that the load current $i_L$ has reached the second threshold value $i_{TH2}$.

When the load current $i_L$ rises and reaches the first threshold value $i_{TH1}$, the first stage 13a does not limit the load current or trigger a switch-off of the transistor $T_L$, but merely slightly discharges the gate of the power transistor $T_L$ to reduce the gate voltage $V_G$ by such an amount that the drain-source voltage $V_{DS}$ rises from very low values of, e.g., a few 10 millivolts to somewhat higher values of e.g. 70-150 millivolts. This increase of the voltage $V_{DS}$ gives the second stage 13b enough voltage headroom to be able to perform the current limitation (or an over-current switch-off) with the required accuracy.

Figure 3:
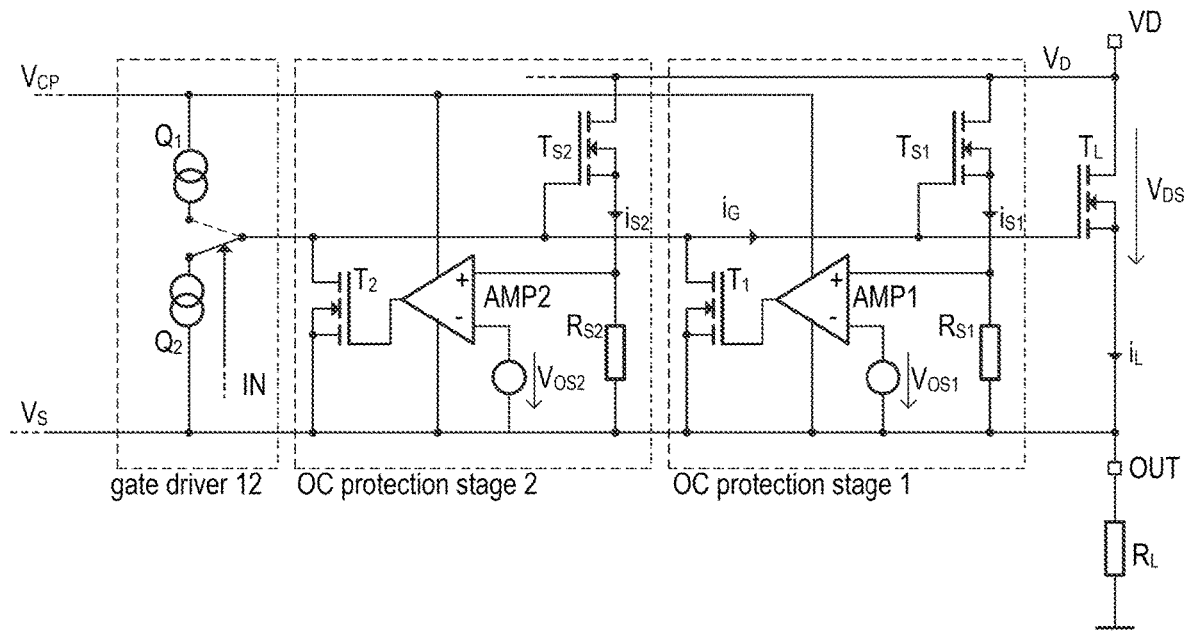
FIG. 3 illustrates one exemplary implementation of the intelligent semiconductor switch of FIG. 2.
Figure 4:
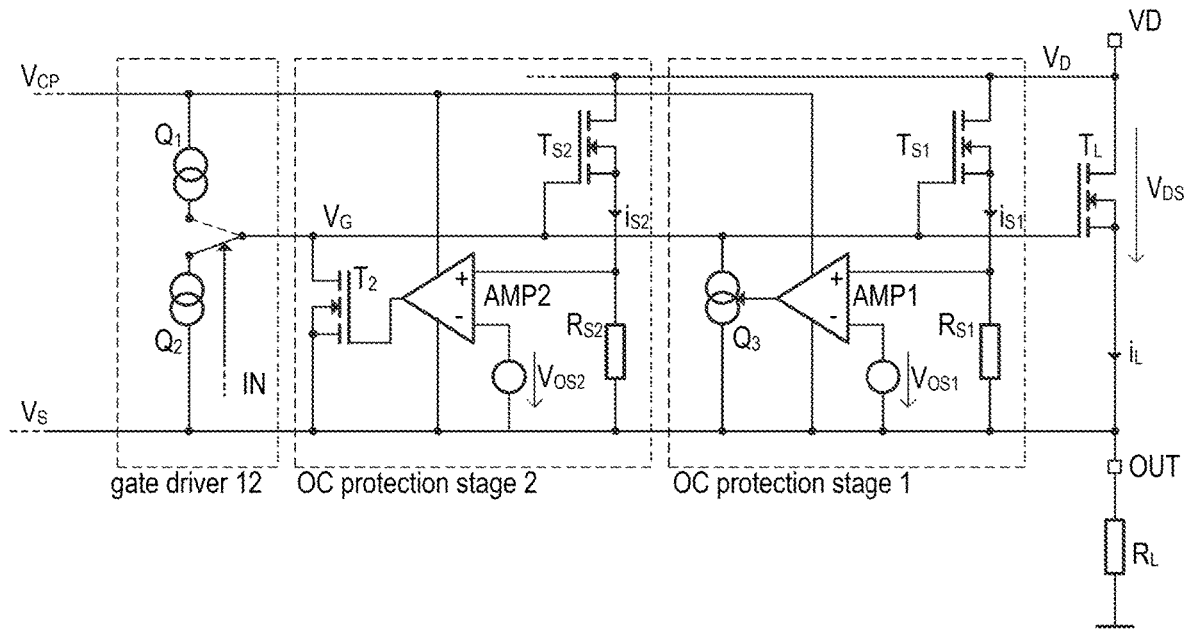
FIG. 4 illustrates another exemplary implementation of the intelligent semiconductor switch of FIG. 2.

FIGS. 3 and 4 illustrate two very similar circuits, wherein exemplary implementations of the two-stage overcurrent protection circuit are shown in more detail. According to the example shown in FIG. 3, each one of the stages, 13a and 13b, of the overcurrent protection circuit includes a current sense circuit. Each current sense circuit is composed of a sense transistor, $T_{S1}$ and $T_{S2}$, and a (current sense) resistor, $R_{S1}$ and $R_{S2}$, connected in series to the drain-source current path of the sense transistor. As discussed above with reference to FIG. 1, the sense transistors $T_{S1}$ and $T_{S2}$ may be composed of one or more transistor cells of the cell array of the power transistor $T_L$. The transistors $T_{S1}$, $T_{S2}$ and $T_L$ have common gate and drain electrodes but separated source electrodes. Therefore, the drain current (provided by the voltage supply) is divided into the load current $i_L$ (which passes through the power transistor $T_L$) and the sense currents $i_{S1}$ and $i_{S2}$, wherein the sense currents $i_{S1}$ and $i_{S2}$ are approximately proportional to the load current $i_L$. As mentioned above, the proportionality factor is determined by the ratio of the active areas (or the ratio of the number of transistor cells) of the transistors $T_L$ and $T_{S1}$ or $T_L$ and $T_{S2}$, respectively. To convert the sense currents $i_{S1}$ and $i_{S2}$ into a voltage signals (current sense signals $V_{RS1}=i_{S1} \cdot R_{S1}$ and $V_{RS2}=i_{S2} \cdot R_{S2}$), the resistors $R_{S1}$ and $R_{S2}$ are connected between the source electrode of the respective sense transistor ($T_{S1}$ or $T_{S2}$) and the output node OUT. In accordance with some embodiments, the resistance of resistor $R_{S1}$ may be lower than the resistance of resistor $R_{S2}$ ($R_{R1}<R_{S2}$).

The first state 13a of the protection circuit includes an amplifier AMP1 configured to amplify a difference between the first current sense signal $V_{RS1}$ and a first offset (reference) voltage $V_{OS1}$. The offset voltage $V_{OS1}$ determines the first threshold value $i_{TH1}$, which, in the present example, approximately equals $k_1 \times V_{OS1}/R_{S1}$ ($k_1$ being the proportionality factor between $i_L$ and $i_{S1}$).

A first control element is coupled to the gate electrode of the power transistor $T_L$ and configured to sink current from the gate electrode, which leads to an increased drain-source voltage $V_{DS}$ in response to an output signal of the amplifier AMP1. In the example depicted in FIG. 3, this control element is a transistor $T_1$ coupled between the gate electrode and the source electrode of the power transistor $T_L$, wherein the conductivity of the transistor $T_1$ is controlled by the output of the amplifier AMP1 which drives the gate of transistor $T_1$.

If the load current $i_L$ reaches the first threshold value $i_{TH1}$ (which is indicated by the current sense signal $VR_{S1}$ reaching the offset voltage $V_{OS1}$), then the amplifier generates a positive output voltage high enough to drive the transistor $T_1$ into a conductive state. Thereby, the transistor $T_1$ is not fully switched on but provides a current path that is conductive enough to sink sufficient charge from the power transistor's gate to reduce the power transistor's gate voltage $V_G$ such that the drain-source voltage $V_{DS}$ of the power transistor $T_L$ increases from a few 10 millivolts to higher values (e.g., 70 to 150 mV).

Once the drain-source voltage $V_{DS}$ of the power transistor $T_L$ is at an elevated level (due to the first stage being active), the second stage 13b of the overcurrent protection circuit is enabled. The second stage 13b may basically operate in the same way as the single-stage protection circuit of FIG. 1 with the (important) difference that the offset (reference) voltage $V_{OS2}$ can be set to a significant higher value as compared to the example of FIG. 1 thus significantly increasing the achievable accuracy of the current limitation circuit. The improved accuracy is achieved because the offset (reference) voltage $V_{OS2}$ can be set to a level high enough so that the intrinsic offset voltage at the input of the operational amplifier APM2 is negligible as compared to the voltage $V_{OS2}$, while $V_{OS2}$ is still lower than the elevated drain source voltage $V_{DS}$.

In the example of FIG. 3, the second overcurrent protection stage 13b includes an amplifier AMP2 configured to amplify a difference between the second current sense signal $V_{RS2}$ and the second reference voltage $V_{OS2}$. The second offset (reference) voltage $V_{OS2}$ determines the second threshold value $i_{TH2}$, which, in the present example, approximately equals $k_2 \times V_{OS2}/R_{S2}$ ($k_2$ being the proportionality factor between $i_L$ and $i_{S2}$). The factors $k_1$ and $k_2$ may be equal ($k_1=k_2=k$).

A second control element is coupled to the gate electrode of the power transistor $T_L$ and configured to sink current from the power transistor's gate electrode in response to an output signal of the amplifier AMP2. In the example depicted in FIG. 3, the second control element is a transistor $T_2$ coupled between the gate electrode and the source electrode of the power transistor $T_L$, wherein the conductivity of the transistor $T_2$ is controlled by the output of the amplifier AMP2 which drives the gate of transistor $T_2$.

If the load current $i_L$ reaches the second threshold value $i_{TH2}$ (which is indicated by the current sense signal $V_{RS2}$ reaching the offset voltage $V_{OS2}$), then the amplifier AMP2 generates a positive output voltage to drive the transistor $T_2$ into a conductive state. Thereby, the transistor $T_2$ is not fully switched on but provides a current path whose conductivity is controlled (by the amplifier output of amplifier AMP2) such that the power transistor's gate voltage $V_G$ is reduced by such an amount that the load current is limited to the desired value (given by the second threshold value).

The amplifier AMP2 may be an operational amplifier with a very high gain G (e.g. $G>10^5 \cdots 10^7$). As can be seen from FIG. 3 the output of the operational amplifier AMP2 is fed back (via transistor $T_1$ affecting the gate voltage VG thus affecting the load current $i_L$ and the current sense signal $V_{RS2}$) to the amplifier's input. This feedback loop allows for a current limitation of the load current such that the current sense signal $V_{RS2}$ approximately equals the offset voltage $V_{OD2}$. It is again emphasized that this current limitation is enabled by the first stage 13a of the overcurrent protection circuit which causes the elevated drain-source current $V_{DS}$ in response to an increasing load current before the current limitation is actually triggered.

Both, the examples of FIGS. 3 and 4, may use the same gate driver circuit 12 that has been discussed above with reference to FIG. 1. However, many other known gate driver circuits may be applicable dependent on the actual application. The examples of FIGS. 3 and 4 are basically the same, wherein the only difference lies in the first overcurrent protection stage 13a. Accordingly, in FIG. 4 the transistor $T_1$ (see FIG. 3) is replaced by a controllable current source $Q_3$ which is configured to be controlled by output of the amplifier AMP1. In one further example, the amplifier AMP1 may operate as a comparator (or may be replaced by a comparator). In this case, the controllable current source $Q_3$ may be configured to be activated and deactivated in accordance with the comparator output. That is, when the current sense signal $V_{RS1}=R_{S1} \cdot i_{S1}$ reaches or exceeds the (low) offset voltage $V_{OS1}$, the comparator (or amplifier) activates the current source $Q_3$ thus causing a reduction of the gate voltage $V_G$ and a respective increase of the drain-source $V_{DS}$.

Figure 5:
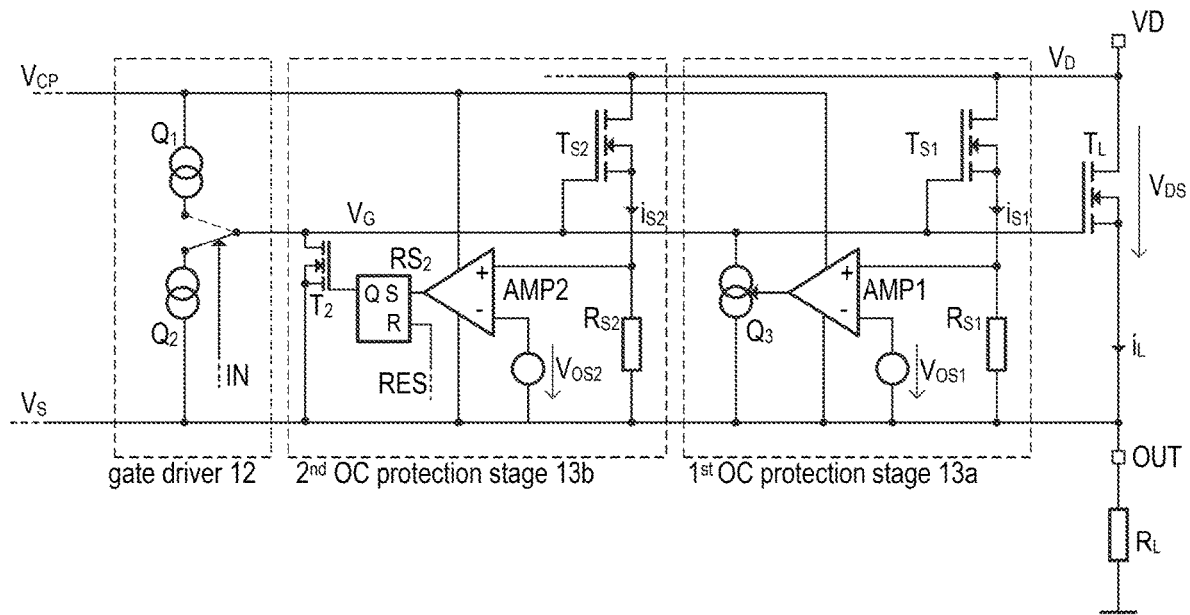
FIG. 5 illustrates a modification of the example of FIG. 4, according to which the overcurrent protection circuit performs a switch-off of the intelligent semiconductor switch instead of a current limitation.

FIG. 5 illustrates a further embodiment, which does not perform a current regulation but rather an over-current switch-off. The example of FIG. 5 is very similar to the example of FIG. 4 with the only difference that an RS-flip-flop (also referred to as SR-latch) is inserted between the output of the amplifier AMP2 and the gate of the transistor $T_2$. In this example, the amplifier may also operate as (or be replaced by) a comparator.

The RS-flip-flop $RS_2$ is set by the output of the amplifier AMP2 providing a High Level (S=1), when the current sense signal $V_{RS2}=R_{S2} \cdot i_{S2}$ reaches or exceeds the second offset voltage $V_{OS2}$. Setting the RS-flip-flop $RS_2$ causes the flip-flop's output Q, which is connected to the gate electrode of the transistor $T_2$, to output a High Level (Q=1), thus switching the transistor $T_2$ on. As soon as the transistor $T_2$ is switched on, the gate electrode of the power transistor $T_L$ is discharged via the drain-source current path of the transistor $T_2$ thus switching the power transistor $T_L$ off.

The power transistor $T_L$ cannot be switched on again as long as the RS-flip-flop $RS_2$ is set because the activated transistor $T_2$ pulls the gate electrode of the power transistor $T_L$ down towards source potential. However, the RS-flip-flop RS2 may be reset by a reset signal RES (RES=1) that may be generated by an external controller or any other external circuitry and supplied to the intelligent semiconductor switch, e.g., via a dedicated chip pin. Once the RS-flip-flop $RS_2$ is reset, the transistor $T_2$ is deactivated (switched off) and the power transistor $T_L$ can be switched on again when a suitable input signal IN is applied to the gate deriver circuit 12.

It is understood that the circuits and block diagrams shown in the figured discussed above are merely examples and that the functions described herein with reference of the figures can be implemented by a skilled person in various ways using different circuit components. For example, as explained above with reference to FIG. 4 or 5, comparators may be implemented using high-gain operational amplifiers. However, other circuitry may be used instead to obtain practically the same function.

Figure 6:
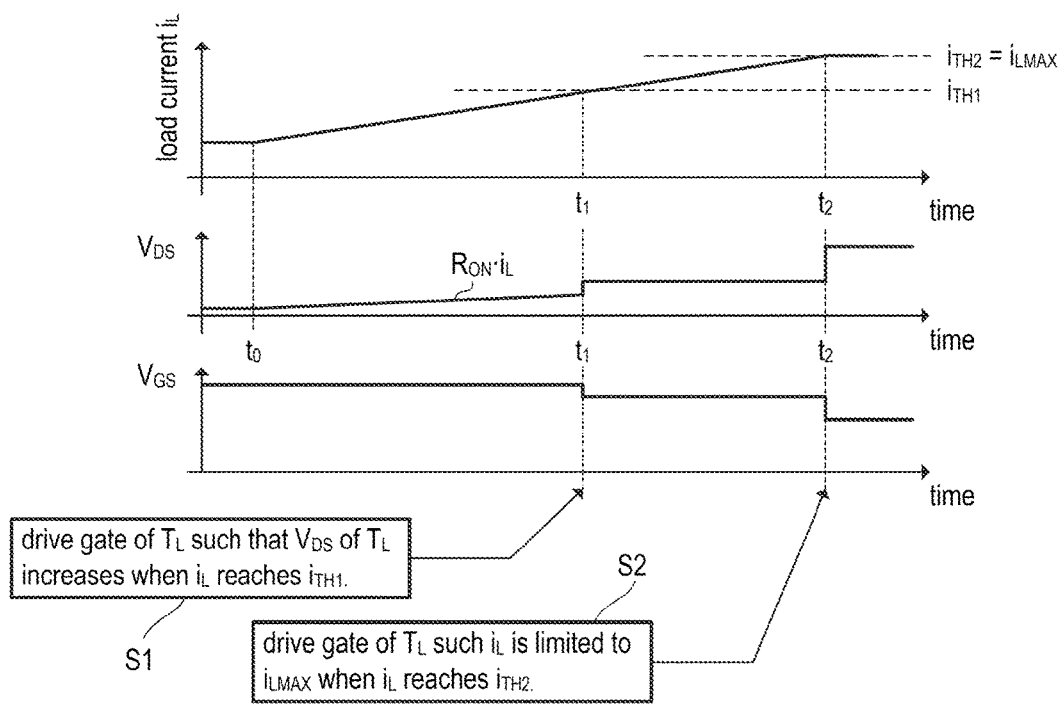
FIG. 6 is a diagram illustrating an overcurrent protection method in accordance with the embodiments described herein.

FIG. 6 is a diagram illustrating an overcurrent protection method in accordance with the embodiments described herein. In particular, FIG. 6 includes exemplary timing diagrams of the load current $i_L$ and the power transistor's gate voltage $V_G$ and drain-source voltage $V_{DS}$. According to the embodiments described herein, the method includes driving the power transistor $T_L$ into a conductive state (on-state) by charging the gate electrode of the power transistor $T_L$. The method further includes driving the gate electrode such that the voltage drop $V_{DS}$ across the load current path of the power transistor $T_L$ increases when the load current $i_L$ reaches (or exceeds) a first threshold value $i_{TH1} \approx k \times V_{OS1}/R_{S1}$ (see FIG. 6, step S1 starting at time instant $t_1$). Moreover, the method includes driving the gate electrode such that the load current $i_L$ is limited to a maximum value $i_{LMAX}$ when the load current $i_L$ has reached the second threshold value $i_{TH2} \approx V_{OS2}/R_{S2}$ (see FIG. 6, step S2 starting at time instant $t_2$). As already discussed above with reference to FIG. 5, a switch-off of the power transistor may be performed instead of current regulation.

In the example of FIG. 6, the load current $i_L$ starts to rise—for whatever reason (e.g. due to an error in the load)—at time instant $t_0$. Between times $t_0$ and $t_1$ the drains-source voltage $V_{DS}$ of the power transistor rises as the load current $i_L$ increases ($V_{DS}=i_L \times R_{ON}$). The gate voltage $V_G$ is at its nominal (maximum) value and the drain-source current path of the transistor $T_L$ has the on-resistance $R_{ON}$. At time $t_1$ the load current reaches the first threshold $i_{TH1}$ which causes the first overcurrent protection stage to reduce the gate voltage $V_G$ thus increasing the drain-source voltage $V_{DS}$. This increases the voltage headroom for the current sense circuit and the offset voltage $V_{OS2}$ in the second overcurrent protection stage as explained in detail above. At time instant $t_2$ the load current $i_L$ reaches the second threshold $i_{TH2}$ thus triggering the current limitation to the maximum value $i_{LMAX}=i_{TH2}$. In the embodiments described herein, the two stages 13a, 13b of the overcurrent protection circuit, in particular the amplifiers AMP1 and AMP2 as well as the voltage sources that provide the offset voltages $V_{OS1}$ and $V_{OS2}$ operate using the electric potential of the output node (source potential of the n-channel power MOS transistor $T_L$) as reference/floating ground potential. Also the supply voltage $V_{CP}$ generated by the charge pump (cf. FIG. 1) and used to supply components of the two stages 13a, 13b of the overcurrent protection circuit uses the electric potential of the output node as floating ground.

Although the invention has been illustrated and described with respect to one or more implementations, alterations and/or modifications may be made to the illustrated examples without departing from the spirit and scope of the appended claims. As mentioned above, the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. A circuit comprising:
   a high-side power transistor including a load current path coupled between a supply node and an output node, which is configured to provide, during operation, a load current to a load;
   a gate driver circuit coupled to a control electrode of the power transistor;
   a first stage of an overcurrent protection circuit coupled to the control electrode of the power transistor and configured to drive the control electrode such that a voltage drop across the load current path of the power transistor increases upon detection that the load current has reached a first threshold value, wherein the first stage includes a first current sensing circuit configured to provide a first current sense signal representing the load current; and
   a second stage of the overcurrent protection circuit coupled to the control electrode of the power transistor and configured to drive the control electrode such that the load current is limited to a maximum value or that the power transistor is switched off upon detection that the load current has reached a second threshold value, wherein the second stage includes a second current sensing circuit configured to provide second current sense signal representing the load current.

2. The circuit of claim 1,
wherein the first threshold value is lower than the second threshold value.

3. The circuit of claim 1, wherein the first stage further includes:
an amplifier configured amplify a difference between the first current sense signal and a first reference voltage, which determines the first threshold value; and
a control element, which is coupled to the control electrode of the power transistor and is configured to sink current from the control electrode in response to an output signal of the amplifier.

4. The circuit of claim 3,
wherein the control element comprises a transistor.

5. The circuit of claim 3,
wherein the control element comprises a controllable current source.

6. The circuit of claim 1, wherein the first stage further includes:
a comparator configured compare the first current sense signal and a first reference voltage, which determines the first threshold value; and
a control element, which is coupled to the control electrode of the power transistor and is configured to sink current from the control electrode.

7. The circuit of claim 6,
wherein the control element comprises a controllable current source.

8. The circuit of claim 1,
wherein the increase of the voltage drop across the load current path of the power transistor results in a change of the characteristics of the second current sensing circuit.

9. The circuit of claim 1,
wherein the increase of the voltage drop across the load current path of the power transistor causes enablement of the second current sensing circuit.

10. The circuit of claim 1, wherein the second stage further includes:
an amplifier configured to amplify a difference between the second current sense signal and a second reference voltage, which determines the second threshold value; and
a control element, which is coupled to the control electrode of the power transistor and is configured to sink current from the control electrode in response to an output signal of the amplifier.

11. The circuit of claim 10,
wherein the control element is configured to limit the load current passing through the power transistor to a desired maximum current by sinking current from the control electrode of the power transistor.

12. The circuit of claim 1, wherein the second stage further includes:
a comparator configured to compare the second current sense signal and a second reference voltage, which determines the second threshold value; and
a control element, which is coupled to the control electrode of the power transistor and configured is to sink current from the control electrode in response to an output signal of the comparator; and
a latch coupled between the output of the comparator and a control electrode of the control element.

13. The circuit of claim 1,
wherein the first current sensing circuit includes a first sense transistor and a first resistor coupled in series and arranged between the supply node and the output node, the first current sense signal being the voltage across the first resistor, and
wherein the second current sensing circuit includes a second sense transistor and a second resistor coupled in series and arranged between the supply node and the output node, the second current sense signal being the voltage across the second resistor.

14. The circuit of claim 13,
wherein the first resistor has a resistance lower than a resistance of the second resistor.

15. A circuit comprising:
a high-side power transistor including a load current path coupled between a supply node and an output node, which is configured to provide, during operation, a load current to a load;
a gate driver circuit coupled to a control electrode of the power transistor;
a first stage of an overcurrent protection circuit coupled to the control electrode of the power transistor and configured to drive the control electrode such that a voltage drop across the load current path of the power transistor increases upon detection that the load current has reached a first threshold value; and
a second stage of the overcurrent protection circuit coupled to the control electrode of the power transistor and configured to drive the control electrode such that the load current is limited to a maximum value or that the power transistor is switched off upon detection that the load current has reached a second threshold value, wherein the first threshold value is lower than the second threshold value.

* * * * *